United States Patent
Russo et al.

[11] Patent Number: 6,110,781
[45] Date of Patent: Aug. 29, 2000

[54] ANISOTROPIC CHEMICAL ETCHING PROCESS OF SILICON OXIDE IN THE MANUFACTURE OF MOS TRANSISTOR FLASH EPROM DEVICES

[75] Inventors: Felice Russo; Giuseppe Miccoli; Alessandro Torsi, all of Avezzano, Italy; Koteswara Rao Chintapalli, Plano, Tex.; Giuseppe Cautiero, Avezzano, Italy

[73] Assignee: Texas Instruments Incorporated, Dallas, Tex.

[21] Appl. No.: 09/115,305

[22] Filed: Jul. 14, 1998

[30] Foreign Application Priority Data

Jul. 14, 1997 [IT] Italy .................. RM97A0430

[51] Int. Cl.$^7$ .................................. H01L 21/336
[52] U.S. Cl. ........................................ 438/261
[58] Field of Search .................. 438/261, 238, 438/262, 800

[56] References Cited

U.S. PATENT DOCUMENTS 5,766,992  4/1997  Chou et al. ................. 438/241
5,897,360  10/1997  Kawaguchi ................. 438/431

*Primary Examiner*—Charles Bowers
*Assistant Examiner*—Craig Thompson
*Attorney, Agent, or Firm*—William B. Kempler; Frederick J. Telecky, Jr.

[57] ABSTRACT

This invention relates to an improvement to an anisotropic chemical etching process for silicon oxide and to a manufacturing process for silicon FAMOS transistor Flash EPROM memory devices including said improvement, said silicon oxide chemical etching process having an etching direction and being characterised in that the following steps are performed:

preliminary deposition of a layer of silicon nitride on the silicon oxide, a first anisotropic chemical etching or break-through stage, along said etching direction, aimed at removing the nitride layer from the silicon oxide surfaces orthogonal to said etching direction;

a second anisotropic chemical etching stage along said etching direction, aimed at removing the silicon oxide surfaces orthogonal to said etching direction.

11 Claims, 2 Drawing Sheets

ANISOTROPIC CHEMICAL ETCHING PROCESS OF SILICON OXIDE IN THE MANUFACTURE OF MOS TRANSISTOR FLASH EPROM DEVICES

This invention broadly relates to an improvement to a anisotropic chemical etching process of silicon oxide.

More particularly, this invention relates to a process of the above kind in which a layer of silicon nitride is isotropically deposited on the silicon oxide and is eventually oxidised after deposition, in order to increase the anisotropy of a subsequent anisotropic chemical etching stage of the silicon oxide.

The above outlined improved process is advantageously exploited during the manufacturing process of fast access, electrically programmable, non-volatile memories, also designated as "Flash EPROM" memories, in which floating gate avalanche injection MOS transistors, also designated as "FAMOS" transistors are provided.

It is known that the manufacture of semiconductor devices is based upon a chemical-physical process comprising a set of stages in which the various components of the specific devices to be manufactured are progressively realised. The semiconductor material mainly utilised is silicon.

It frequently happens that, in respect of silicon devices, during said chemical-physical working process, the necessity arises to carry out one or more treatment steps in which a previously realised silicon dioxide is subjected to a plasma-assisted anisotropic chemical etching treatment aimed at maintaining said dioxide, for instance, on the vertical walls of not plagiarised structures and at removing it from horizontal surfaces.

Such need is particularly severe in the production of FAMOS transistors Flash EPROM memory devices, since said FAMOS transistors are substantially constituted by MOS transistors having their gate region insulated with respect to its external environment.

The manufacturing process of a FAMOS transistor preferably is carried out by performing the following steps.

A thin layer of silicon dioxide, designated as "Tunnel Oxide" or "Gate Oxide" is grown on the whole substrate, which is already provided with straight parallel sectors having a thick layer of silicon dioxide, designated as "Field Oxide", grown thereupon.

A layer of poly-crystalline silicon (or polysilicon), designated as "poly-1" is deposited upon said Tunnel Oxide" and it is subsequently doped, for instance with phosphorous, in order to make it even more conductive. Said poly-1 forms the floating gate region.

An electrically insulating three-layer silicon structure (oxidenitride-oxide: $SiO_2$—$Si_3N_4$—$SiO_2$), designated as "ONO", is subsequently deposited upon said poly-1 layer.

A layer of polysilicon, designated as "poly-2", is deposited upon said ONO layer and it is subsequently doped, for instance again with phosphorous, and lastly a metal layer of tungsten silicide (WSi) is deposited upon said poly-2 layer. The poly-2 and the silicide layers form the control gate.

Subsequently, a photolithographic process is carried out to define the length of the FAMOS transistor cell and a suitable plasma-assisted chemical etching step, also designated as "stack etch" step etches the stack of silicide, poly-2, ONO and poly-1 layers and removes them wherever necessary, up to the tunnel oxide layer where the etching operation is stopped and in this way it defines the sizes of the gate stacks of the concerned FAMOS transistors and consequently the sizes of the cells.

At the end of the gate stack formation, a thermal "annealing" treatment is performed under oxygen atmosphere in order to cause a thin layer of oxygen dioxide to grow on the whole exposed surfaces of the gate stacks, thereby creating in particular the oxide barrier on the side walls of the poly-1 layer, as it is necessary to prevent any leakage of the charge stored in the floating gate regions toward the poly-2, drain and source regions.

After said annealing step, the process provides for defining the areas constituting the connection lines of the source regions upon which the thin layers of said tunnel oxide and the thick layers of said field oxide are alternatively applied, by means of a photolithographic process. Such areas are then subjected to an anisotropic, plasma assisted, chemical etching operation of the oxide, designated as "Self Aligned Source (SAS) etch", aimed at exposing the underlying substrate to the subsequent operation of the dopant agent implantation.

The subsequent chemical treatment steps of the devices provide for doping the drain regions, by means of an implantation operation through the gate oxide acting as a shield, and subsequently for metallising and passivating the so manufactured devices.

An important parameter to evaluate the quality of a Flash EPROM memory is the so called "Data Retention Loss", also known as DRL figure. Said DRL figure is quantitatively expressed by checking the capability of the concerned memory device to retain test data upon being subjected to highly stressing treatment.

Aiming at minimising the DRL figure of Flash EPROM memory devices, it is necessary that an oxide layer be provided on the side walls of the poly-1 layer as well as that a gate oxide layer be maintained at the base of the gate stack. In particular, the maintainment of the gate oxide at the base of the gate stack also allows to obtain a higher immunity or sturdiness in respect of any electric noise between contiguous cells, thereby avoiding spurious deletion and/or write effects.

Due to the performance limitations existing in the equipment in which said SAS etch operation is carried out as well as in the chemical etching chemistry itself, said theoretically anisotropic SAS etching operation in effect also removes the oxide grown on the side walls of poly-1 and at the base of the gate stack.

In this respect, just as a consequence of the fact that said SAS etch operation is not ideally anisotropic, the essential factor in leaving an oxide layer of sufficient thickness upon the side walls of poly-1 is represented by the gate stack profile as determined by said stack etch operation. However, also high performance stack etch processes cause a not orthogonal gate stack profile to be obtained with respect to the gate oxide. This entails that the SAS etch process more easily removes the oxide from the side walls of poly-1 and the gate oxide at the bottom section of the gate stack and in certain cases it also happens that even material existing under the stack is removed.

Therefore, this entails a significant deterioration of the DRL figure and, as a consequence of the sensitivity of DRL to the variations of the stack etch and of the SAS etch process performances, also the sturdiness of the process is jeopardised.

In the prior art, aiming at compensating any loss of oxide around poly-1 while the DRL figure is minimised, an additional thermal oxidation is carried out during one of the annealing steps subsequent to the dopant agent implantation into the source areas.

Anyway, performing a new thermal oxidation has certain disadvantages.

In the first place, said oxidation operation does not uniformly take place on the various layers of the gate stack, thereby jeopardising its quality.

Besides that, in the crystalline lattice of the substrate, interstitial silicon atoms are very rapidly diffused to such extent as to agglomerate upon already existing defects, thereby causing the formation of dislocations, also designated as "stacking faults" which, in turn, cause the formation of short circuits between the source and drain regions.

In view of the above, performing a new thermal oxidation operation entails a decrease in the manufacturing process efficiency with consequent significant economic losses.

It is the object of this invention, therefore, to enhance the anisotropy of a chemical etching process, possibly a plasma assisted process, if desired, of silicon oxide, in order to enable, in simple and reliable way, in a manufacturing process of FAMOS transistor Flash EPROM memory devices, the oxide layer to be maintained on the side walls of the poly-1 layer as well as the tunnel oxide to be maintained at the bottom of the gate stack, so as to minimise the DRL figure and improve the insensitivity to electric noise among the memory cells, without modifying the FAMOS transistor characteristics.

It is a further object of this invention to increase the sturdiness of the process, by reducing the sensitivity of the DRL figure to any variations of the stack etch and of the SAS etch process performances.

Specific subject-matter of this invention is an improvement to the anisotropic chemical etching process of silicon oxide, having an etching direction, characterised in that the following steps are performed:

a preliminary deposition of a layer of silicon nitride ($Si_3N_4$) on the silicon oxide ($SiO_2$);

a first anisotropic chemical etching or break-through stage, along said etching direction, aimed at removing the nitride layer from the silicon oxide surfaces orthogonal to said etching direction;

a second anisotropic chemical etching stage along said etching direction, aimed at removing the silicon oxide surfaces orthogonal to said etching direction.

Further according to this invention, said process can also provide, after said preliminary deposition step of a silicon nitride layer, a surface oxidisation step of said silicon nitride layer, in aqueous vapour, preferably at a temperature lower than the temperatures at which the thermal oxidisation of the silicon and the diffusion of the dopants are performed.

Preferably, according to this invention, said preliminary deposition operation is a plasma-assisted chemical vapour deposition (PCVD) or a low-pressure chemical vapour deposition (LPCVP) or an energy-enhanced chemical vapour deposition and it takes place at a temperature lower than the temperatures at which the thermal oxidisation of the silicon and the diffusion of the dopants are performed.

It is further specific subject-matter of this invention a manufacturing process of silicon FAMOS transistor, Flash EPROM memory devices, including a first set of chemical-physical treatment steps for forming the gate stacks of said FAMOS transistors, ending with an anisotropic chemical etching step, possibly plasma assisted, or stack etch step, aimed at defining the dimensions of said gate stacks and with an annealing step, under oxygen atmosphere, aimed at growing a thin layer of silicon oxide on the whole exposed surfaces of said gate stacks, and a second set of chemical-physical treatment steps for doping the silicon substrate in corresponding locations to the source and drain regions of said FAMOS transistors, beginning with dopant implantation in the source lines, characterised in that the following steps are carried out between said first and second sets of chemical-physical treatment steps:

a preliminary deposition operation of a silicon nitride layer upon said thin silicon oxide layer, a photolithographic process aimed at defining the areas that form the source lines, a first anisotropic chemical etching operation, possibly plasma assisted, or break-through step, having such an etching direction as to remove the nitride layer from said source line forming areas, a second anisotropic chemical etching operation according to said etching direction, aimed at removing said silicon oxide layer from said source line forming areas.

The present invention will be now described, by way of illustration and not by way of limitation, according to its preferred embodiment, by particularly referring to the Figures of the annexed drawings, in which FIG. 1 is schematic fragmentary plan view of a FAMOS transistor memory device, before the SAS etch step in the manufacturing process;

All annexed Figures are drawn in real scale, but are only given by way of illustration.

Figure 1:
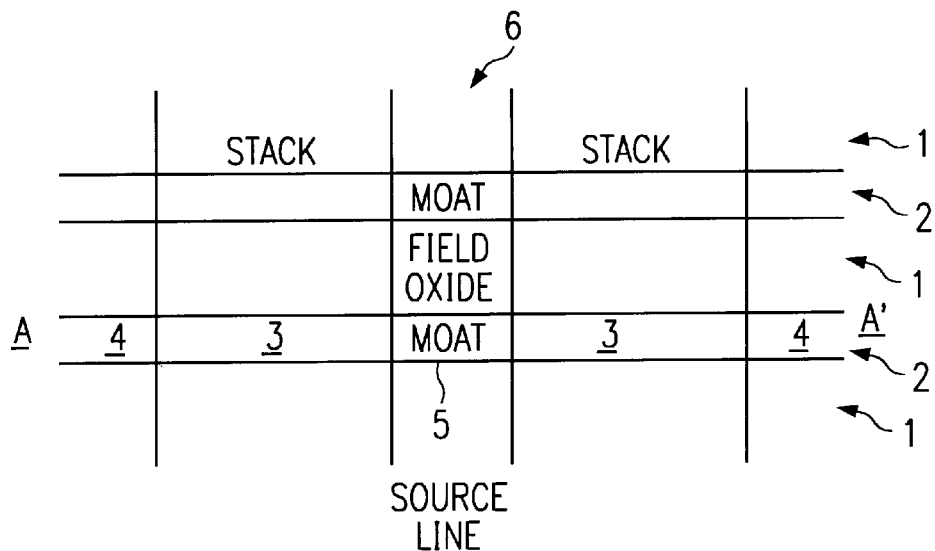

By referring now to FIG. 1, it can be observed that, during the manufacturing process, before the SAS etch step of the manufacturing process, a FAMOS transistor Flash EPROM memory device includes horizontal parallel sectors 1 having the thick oxide layer or so-called Field Oxide grown thereupon and arranged in such a way as to separate from one another the horizontal sectors 2 upon which the FAMOS transistor cells are manufactured. Said FAMOS transistor cells are centrally provided with a gate stack 3 which is laid upon the substrate channel separating the drain region 4 and the source region 5. Vertical sectors 6 constitute the source lines. Each source line is so designed as to connect the various source regions 5 belonging to it in short circuit, in order to form the common source line for a word of the memory device. Aiming at forming this connection, as previously described, the local oxide is to be removed from each of said vertical sectors 6, by performing said SAS etch step, and the necessary dopant agent is to be implanted therein.

Figure 2:
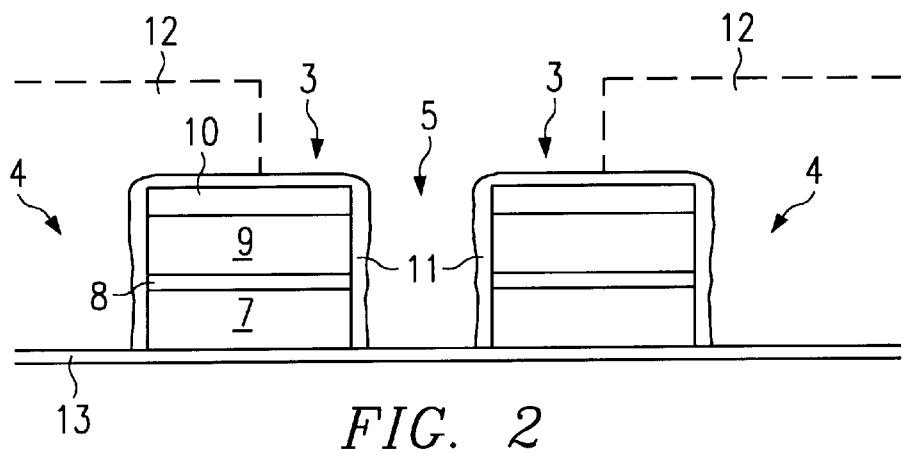
FIG. 2 is a front elevation cross-section view of a device according to FIG. 1, before the SAS etch step in a conventional manufacturing process.

A cross-section view along line A–A' of FIG. 1 is shown in FIG. 2, in respect of a horizontal sector 2 of a device manufactured according to a conventional process, before the SAS etch step. A layer 7 of poly-1, a layer 8 of ONO, a layer 9 of poly-2 and a layer 10 of silicide can be observed within the gate stack 3. In particular, it can be observed that the annealing step carried out after the stack etch step causes a thin layer 11 of silicon dioxide to grow around the gate stack 3. A protection layer 12 of "resist" is shown in dashed line in the Figure, said protection layer being patterned according to photolithographic techniques, the resolution limits of which do not allow a perfect alignment to the edge of the gate stack 3 to be achieved. It is also possible to observe the Tunnel Oxide layer 13.

Figure 3:
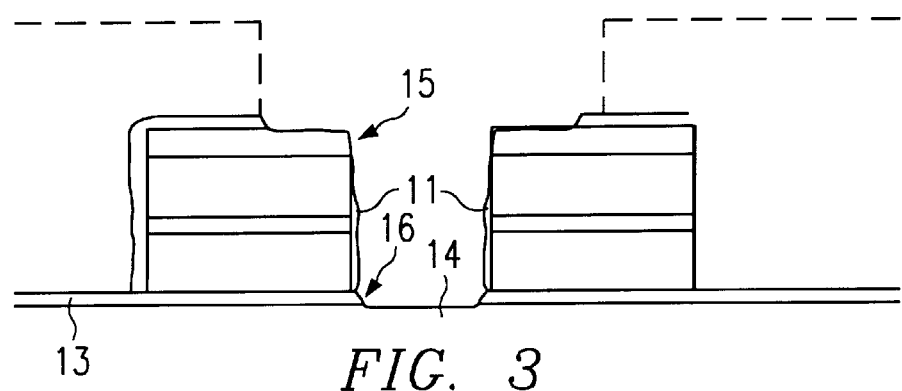
FIG. 3 is a front elevation cross-section view of a device according to FIG. 1, after the SAS etch step in conventional manufacturing process.

A cross-section view of FIG. 2 is shown in FIG. 3, after having performed the SAS etch step according to a conventional manufacturing process. It can be observed that the removal of the Tunnel Oxide layer 13 (as well as of the Field Oxide layer) exposes the silicon substrate portion 14 corresponding to the source region (and line). Anyway, due to not-ideal anisotropy of the SAS etch operation, also the oxide layer 11 existing on the side walls of the gate stack, on the side of the source region 5, appears to have been at least partially etched and particularly it appears to have been completely removed at the top section 15 and to have been noticeably thinned at the bottom section 16 of the walls, with respect to the side of the drain region 4. Such thinning and even more the complete removal of the oxide layer from the side wall of the poly-1 layer 7 makes the loss of the charge stored in the floating gate possible, for instance by tunnel effect, thereby decreasing the DRL figure of the concerned device. As previously discussed, the more such etching effect of the oxide layer 11 along the side walls of the gate stack is severe, the more the profile of the gate stack 3 is tilted and blurred.

Figure 4:
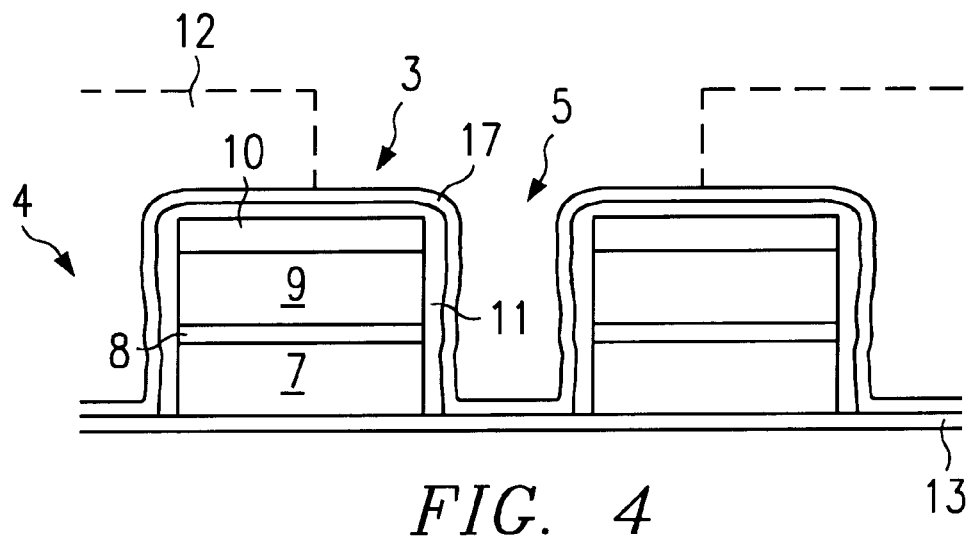
FIG. 4 is a front elevation cross-section view of a device according to FIG. 1, before the SAS etch step of the manufacturing process according to this invention.

By referring now to FIG. 4, it can be observed that the approach suggested according to this invention provides for depositing a thin layer 17 of silicon nitride ($Si_3N_4$) on the whole device being manufactured, said deposition being carried out after said annealing step subsequent to the stack etch step and before the photolithographic step by which the source lines are defined.

Subsequently, the surface of such layer 17 of silicon nitride can be oxidised, in order to form silicon oxi-nitride. Such oxidisation operation improves the characteristics of the concerned nitride in view of the subsequent chemical etching treatment and of the magnetic permeability.

The presence of said thin layer 17 of silicon nitride or oxi-nitride, which will be designated as "nitox" hereinafter, does not entail any change to the subsequent photolithographic step performed to define the source line pattern.

The SAS etching step aimed at etching the source line oxide is preceded by a plasma-assisted anisotropic chemical etching operation, of very short duration, intended to remove the nitox layer from the horizontal surfaces, so as to expose the source lines to the subsequent SAS etch step. Such a chemical etching operation applied to the nitox layer, also designated as "break-through" operation has a very short duration and sufficient anisotropic properties as not to substantially etch the nitox layer on the vertical walls.

Therefore, during the SAS etch step, the nitox layer 17 existing on the side walls of the gate stack 3, on the side of said source region 5, acts as a shield for the underlying oxide layer 11. In fact, said SAS etching operation is designed so as to be extremely selective in respect of the nitox layer 17 and to rapidly etch the silicon oxide. The oxide etching rate, therefore, is extremely higher than the nitox etching rate.

Figure 5:
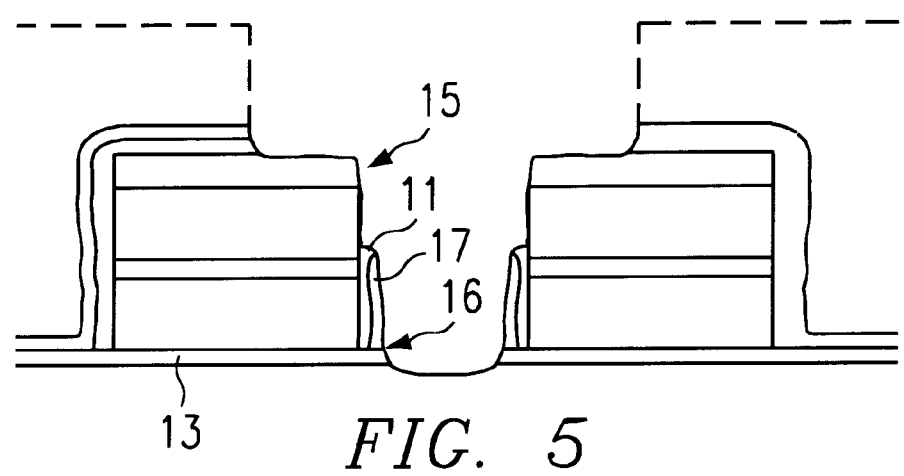
FIG. 5 is a front elevation cross-section view of a device according to FIG. 1 after the SAS etch step of the manufacturing process according to this invention.

By referring now to FIG. 5, it can be observed that the presence of said nitox layer 17 maintains the thickness of the oxide layer 11 almost unchanged, particularly in correspondence to the poly-1 layer 7. Furthermore, it should be understood that FIG. 5 shows the results obtained by means of a SAS etching operation carried out by low performance equipment and, therefore, it illustrates a particularly negative case. When higher performance apparatuses are employed, it is possible to obtain a protection of the concerned oxide layer 11 on the whole side wall of the gate stack 3 and on the top section 15, as well.

The above illustrated nitox layer 17 is adapted to protect the oxide layer 11 on the side wall of the gate stack 3 even when the stack etch operation creates a not-sharp and tilted profile of said gate stack 3, thereby reducing the sensitivity of the manufacturing process of these devices to the possible variations of the stack etch step performances, namely enhancing the tolerance figure of the process in respect of such variations and increasing in this way the sturdiness of the process.

The above said nitox layer 17 obviously also protects the base portion 16 of the gate stack 3 and thus prevents the Tunnel Oxide layer 13 from being etched away from below the stack itself. By maintaining such portion of said Tunnel Oxide layer 13 in integral condition, an increase in immunity to electric noise caused by write or delete operations in adjacent cells is achieved.

The introduction of treatment steps connected with deposition of said silicon nitride layer 17, as well as with subsequent surface oxidation thereof does not appreciably modify the manufacturing process line, since such treatment steps are already utilised, for instance, in the construction of said ONO layer 8 and are particularly simple. In particular, the above explained break-through step, considered as belonging to the SAS etch step, extends its duration only by an amount of a few seconds.

The impact on the characteristics of the FAMOS transistor cells is also easily controllable. In fact, the increase in the length of the transistor channel, as caused by the thickness of said nitox layer 17, can be easily balanced for instance by extending the diffusion times of the implanted dopant agents or by reducing the thickness of the oxide grown during the annealing operation carried out subsequently to the stack etch step.

The temperatures at which the deposition of nitride and its oxidisation in aqueous vapour are carried out are significantly lower than the temperatures at which the thermal oxidisation and dopant diffusion operations are performed. In view of this, said temperatures have a substantially negligible impact on the device being manufactured, because the sole doped regions existing before the SAS etch step are geometrically extended and have a low dopant concentration, as well.

In conclusion, the manufacture of said nitox layer 17, which can be easily inserted into the manufacturing process line, maintains the oxide layer 11 on the side wall of the gate stack 3 in corresponding location to the poly-1 layer 7 and, therefore, it allows a significant reduction of the DRL figure, thereby increasing the device quality and the throughput of the manufacturing process. Furthermore, it maintains the integrity of the Tunnel Oxide layer 13 under the gate stack 13 and consequently it enhances the sturdiness of the cells in respect of electric noise.

The approach as suggested by this invention has been described in connection with the SAS etch step in the manufacturing process of FAMOS transistor Flash EPROM memory devices.

It should be understood, however, that the solution suggested in order to increase the anisotropic behaviour of the chemical etching operation of silicon dioxide can be advantageously exploited in other processes, without so departing from the scope of this invention.

The preferred embodiment of this invention has been hereinbefore explained, but it should be understood that those skilled in the art can made variations and changes therein without departing from the scope of this invention, as defined in the annexed claims.

We claim:

1. An improvement in the anisotropic chemical etching process of silicon oxide, having an etching direction, comprising the following steps:

providing a preliminary deposition of a layer (17) of silicon nitride ($Si_3N_4$) on silicon oxide ($SiO_2$);

performing a first anisotropic chemical etching or break-through stage, along an etching direction, for removing the nitride layer (17) from the silicon oxide surfaces orthogonal to said etching direction; and performing a second anisotropic chemical etching stage along said etching direction, for removing the silicon oxide surfaces orthogonal to said etching direction.

2. The process according to claim 1 wherein after said preliminary deposition step of a silicon nitride layer (17), a surface oxidizing step of said silicon nitride layer is carried out in aqueous vapor.

3. The process according to claim 1 wherein said preliminary deposition operation is selected from the group consisting of a plasma assisted chemical vapor deposition (PCVD), a low-pressure chemical vapor deposition (LPCVP), or an energy-enhanced chemical vapor deposition.

4. The process according to claim 1 wherein said preliminary deposition operation takes place at a temperature lower than the temperatures at which the thermal oxidisation of the silicon and the diffusion of the dopants are performed.

5. The process according to claim 2 wherein said surface oxidization in aqueous vapor of said silicon nitride layer is carried out at a temperature lower than the temperatures at which the thermal oxidizing of the silicon and the diffusion of the dopants are performed.

6. A process for manufacturing fast access electrically programmable non-volatile silicon memory devices or "Flash EPROM" memory devices, based upon floating-gate avalanche-injection MOS or "FAMOS" transistors, comprising the steps of:

performing a first set of chemical-physical treatment steps for forming the gate stacks (3) of FAMOS transistors, ending with an anisotropic chemical etching step or stack etch step, for defining the dimensions of said gate stacks (3) and with an annealing step, under oxygen atmosphere, for growing a thin layer (11) of silicon oxide on the whole exposed surfaces of said gate stacks (3), performing a preliminary deposition operation of a silicon nitride layer (17) upon said thin silicon oxide layer (11), performing a photolithographic process aimed at defining the areas (6) that form the source lines, performing a first anisotropic chemical etching operation or break-through step, having such an etching direction as to remove the nitride layer (17) from said source line forming areas (6)

performing a second anisotropic chemical etching operation according to said etching direction, for removing said silicon oxide layer (11) from said source line forming areas (6), and performing a second set of chemical-physical treatment steps for doping the silicon substrate in corresponding locations to the source and drain regions of said FAMOS transistors, beginning with dopant implantation in the source lines.

7. The process according to claim 2 wherein said preliminary deposition operation is selected from the group consisting of a plasma-assisted chemical vapor deposition (PCVD), a low-pressure chemical vapor deposition (LPCVP), or an energy-enhanced chemical vapor deposition.

8. The process according to claim 2 wherein said preliminary deposition operation takes place at a temperature lower than the temperatures at which the thermal oxidization of the silicon and the diffusion of the dopants are performed.

9. The process according to claim 3 wherein said preliminary deposition operation takes place at a temperature lower than the temperatures at which the thermal oxidization of the silicon and the diffusion of the dopants are performed.

10. The process according to claim 3 wherein said surface oxidisation in aqueous vapour of said silicon nitride layer is carried out at a temperature lower than the temperatures at which the thermal oxidizing of the silicon and the diffusion of the dopants are performed.

11. The process according to claim 4 wherein said surface oxidisation in aqueous vapour of said silicon nitride layer is carried out at a temperature lower than the temperatures at which the thermal oxidizing of the silicon and the diffusion of the dopants are performed.

* * * * *